United States Patent [19]
Westerkamp

[11] Patent Number: 5,428,246
[45] Date of Patent: * Jun. 27, 1995

[54] HIGHLY INTEGRATED ELECTRONIC COMPONENT WITH HEAT-CONDUCTIVE PLATE

[75] Inventor: Hugo Westerkamp, Wolfenbuettel Salzdahlum, Germany

[73] Assignee: LSI Logic Products GmbH, Braunschweig, Germany

[*] Notice: The portion of the term of this patent subsequent to Jul. 6, 2010 has been disclaimed.

[21] Appl. No.: 85,873

[22] Filed: Jul. 6, 1993

Related U.S. Application Data

[63] Continuation of Ser. No. 727,048, Jul. 9, 1991, Pat. No. 5,225,710.

[30] Foreign Application Priority Data

Jul. 9, 1990 [DE] Germany ............... 40 21 871.6

[51] Int. Cl.⁶ ......................................... H01L 23/48
[52] U.S. Cl. ............................ 257/675; 257/713; 257/691; 257/695; 361/676
[58] Field of Search ............... 361/379, 388, 389, 676, 361/707; 257/695, 691, 713, 675

[56] References Cited

U.S. PATENT DOCUMENTS

| | | | |
|---|---|---|---|
| 4,862,246 | 8/1989 | Masuda et al. | 357/70 |
| 4,884,124 | 11/1989 | Mori et al. | 357/72 |
| 4,947,237 | 8/1990 | Fasaroli | 357/72 |
| 5,006,919 | 4/1991 | Disko | 357/80 |
| 5,032,895 | 7/1991 | Horiuchi et al. | 257/695 |
| 5,041,902 | 8/1991 | McShane | 357/80 |
| 5,225,710 | 7/1993 | Westerkamp | 257/713 |
| 5,252,855 | 10/1993 | Ogawa et al. | 257/676 |

FOREIGN PATENT DOCUMENTS

| | | |
|---|---|---|
| 2858087 | 11/1978 | Germany . |
| 2931449 | 2/1980 | Germany . |
| 3708309 | 10/1987 | Germany . |
| 01-14942 | 1/1989 | Japan . |

OTHER PUBLICATIONS

Rudolf F. Graf, Radio Shack Dictionary of Electronics, Second Edition, p. 36, 1978.

*Primary Examiner*—William Mintel
*Assistant Examiner*—Roy Potter
*Attorney, Agent, or Firm*—Foley & Lardner

[57] ABSTRACT

A highly integrated electronic component comprised of a semiconductor body cast into a plastics enclosure. A multiplicity of metallic terminals protrude from the plastic enclosure, and a heat-conducting plate is cast into the plastic enclosure and is in surface contact with an underside of the semiconductor body. Good heat removal and an increase in the mechanical stability for the terminals are achieved by the heat-conducting plate being substantially planar and bearing both against the underside of the semiconductor body and against the underside of the terminals and by the upper side of the heat-conducting plate having a thin, electrically insulating layer.

18 Claims, 5 Drawing Sheets

HIGHLY INTEGRATED ELECTRONIC COMPONENT WITH HEAT-CONDUCTIVE PLATE

This application is a continuation, of application Ser. No. 07/727,048, filed Jul. 9, 1991 now U.S. Pat. No. 5,225,710.

BACKGROUND OF THE INVENTION

The invention relates to a highly integrated electronic component comprising a semiconductor body cast into a plastic enclosure, a multiplicity of metallic terminals which protrude from the plastic enclosure, and a heat-conducting plate. The plate is cast into the plastic enclosure and is in surface contact with an underside of the semiconductor body.

The fabrication of highly integrated electronic components is leading to an ever greater integration density, that is to say to an ever greater number of electronic components realized on a plastic body. With the increase in components, the number of terminals leading out from the semiconductor body increases. Presently terminal numbers in excess of 200 are already possible. The terminals are usually produced with lead frames, generally with leads which are cut out from a sheet-like material. The connection of the terminals to the corresponding terminal faces of the semiconductor body is generally established with the aid of bonding wires. After separating the frame connecting the free ends of the terminal conductors, the terminals are regularly bent off through 90°. This facilitates the automatic soldering into a circuit board or the like. The mechanical stability of the component is established by the plastic enclosure. With the increasing number of electronic components integrated in the plastic body, the energy consumed in the semiconductor body increases. It is therefore known to bring the finished highly integrated electronic component into contact with heat-conducting plates. The heat removal thereby achieved is of course small.

It is further known to provide a component comprising a semiconductor body and a plastic enclosure with an integrated heat-conducting plate. The heat-conducting plate is shaped in such a way that the underside of the semiconductor body is in contact with the heat-conducting plate. The terminals extend upwards at an angle from the semiconductor body and then run horizontally to the outside of the plastic enclosure. The heat-conducting plate is bent off obliquely downward from the underside of the semiconductor body so as to run at a certain distance parallel to the terminals horizontally in the plastic enclosure. This shaping ensures that no electric contact takes place between the terminals and the heat-conducting plate.

SUMMARY OF THE INVENTION

It is therefore an object of the present invention to provide an improved highly integrated electronic component of the type previously described.

A further object of the invention resides in the provision of an improved highly integrated electronic component that has improved performance properties and can be fabricated more easily.

In accomplishing the foregoing objects, there has been provided an electronic component comprising a semiconductor body cast into a plastic enclosure, multiple metallic terminals which protrude from the plastic enclosure, and a heat-conducting plate which is cast into the plastic enclosure and is in surface contact with an underside of the semiconductor body, wherein the heat-conducting plate is substantially planar and bears both against the underside of the semiconductor body and against the underside of the terminals and wherein the upper side of the heat conducting plate contains an electrically insulating layer.

Further objects, features and advantages of the present invention will become apparent from the detailed description of preferred embodiments that follows.

DETAILED DESCRIPTION OF PREFERRED EMBODIMENTS

Figure 1:
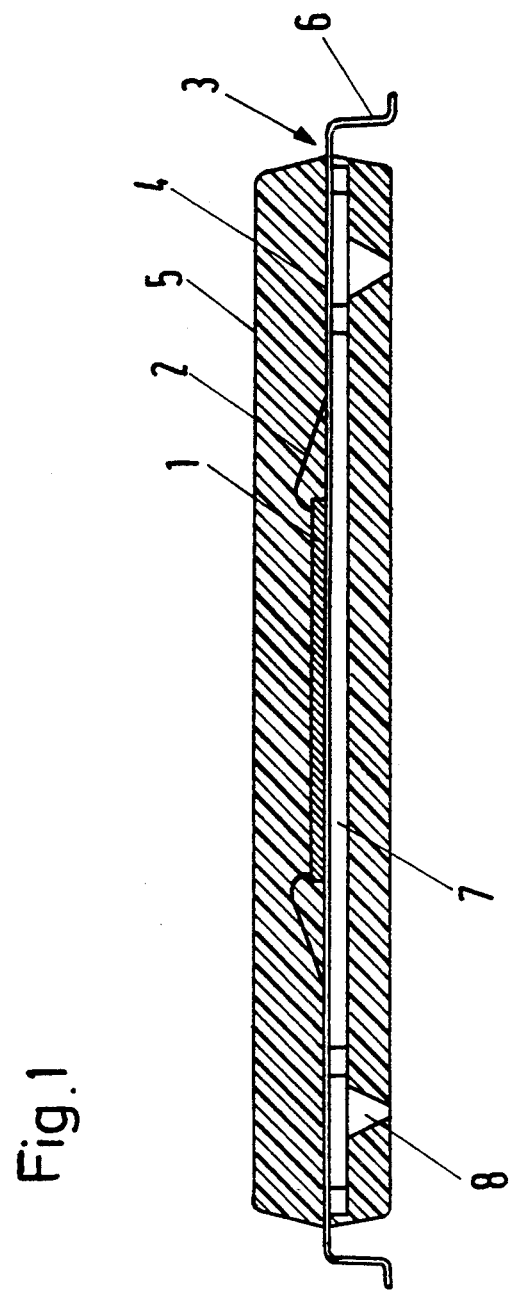
FIG. 1 shows a cross section through a first embodiment of a highly integrated electronic component.

The invention is therefore based on the problem of designing the heat-conducting plate in such a way that the heat-conducting plate not only provides good heat removal but also provides support for the mechanical stability of the terminals. To solve this problem, the heat-conducting plate is provided on its upper side with a thin, electrically insulating layer, preferably, which should not markedly impair the thermal conductivity.

Such an electrically insulating layer which does not markedly impair the thermal conductivity can be formed in a preferred embodiment by anodizing the heat-conducting plate. In this case, the anodizing should have a minimum thickness of about 30 $\mu$. Other insulating layers are also suitable.

The fabrication of the highly integrated electronic component is simplified if the heat-conducting plate is provided with embossed feet, by which it can be placed into the injection mold for the plastic enclosure. Consequently, on the finished component the embossed feet extend to the underside of the plastic enclosure.

For satisfactory production of the plastic enclosure it has proved beneficial, especially in the case of a rectangular highly integrated electronic component, for the heat-conducting plate to be shaped in such a way that said plate has a substantially rectangular outer contour coinciding with the rectangular shape of the plastic enclosure. Preferably the plate is provided in the corners with diagonally running incisions. These incisions preferably extend almost up to the semiconductor body, while maintaining adequate stability of the heat-conducting plate. The diagonal incisions provide good, uniform plastic transport during the injection-molding of the plastic for the plastic enclosure through the planes of the heat-conducting plate, so that a void-free, undisturbed plastic enclosure can be produced on both sides. In an additional form of shaping, it has been found to be beneficial if, at two diagonally opposite corners, the heat-conducting plate is extended up to the side edges of the plastic enclosure by two webs bounding the diagonal incisions, whereas at the two other corners the plate maintains a distance from the side edges of the plastic enclosure.

For sizeable components, which consequently also require a sizeable heat-conducting plate, the moldability of the plastic enclosure is facilitated if through-openings in the heat-conducting plate are arranged around the semiconductor body. These through-openings are preferably of an elongate design and radially extended.

With the heat-conducting plates according to the invention, previously unachievable degrees of integration of the highly integrated electronic components can be realized in plastic packages. The heat which is generated by the component is reliably removed, and the stability of the terminal arrangements is significantly increased by the heat-conducting plate. In addition, the planar design of the heat-conducting plate allows the use of various chip sizes without changing the configuration of the heat-conducting plate.

The invention is to be explained in greater detail below with reference to the illustrative embodiments represented in the drawings.

Figure 2:
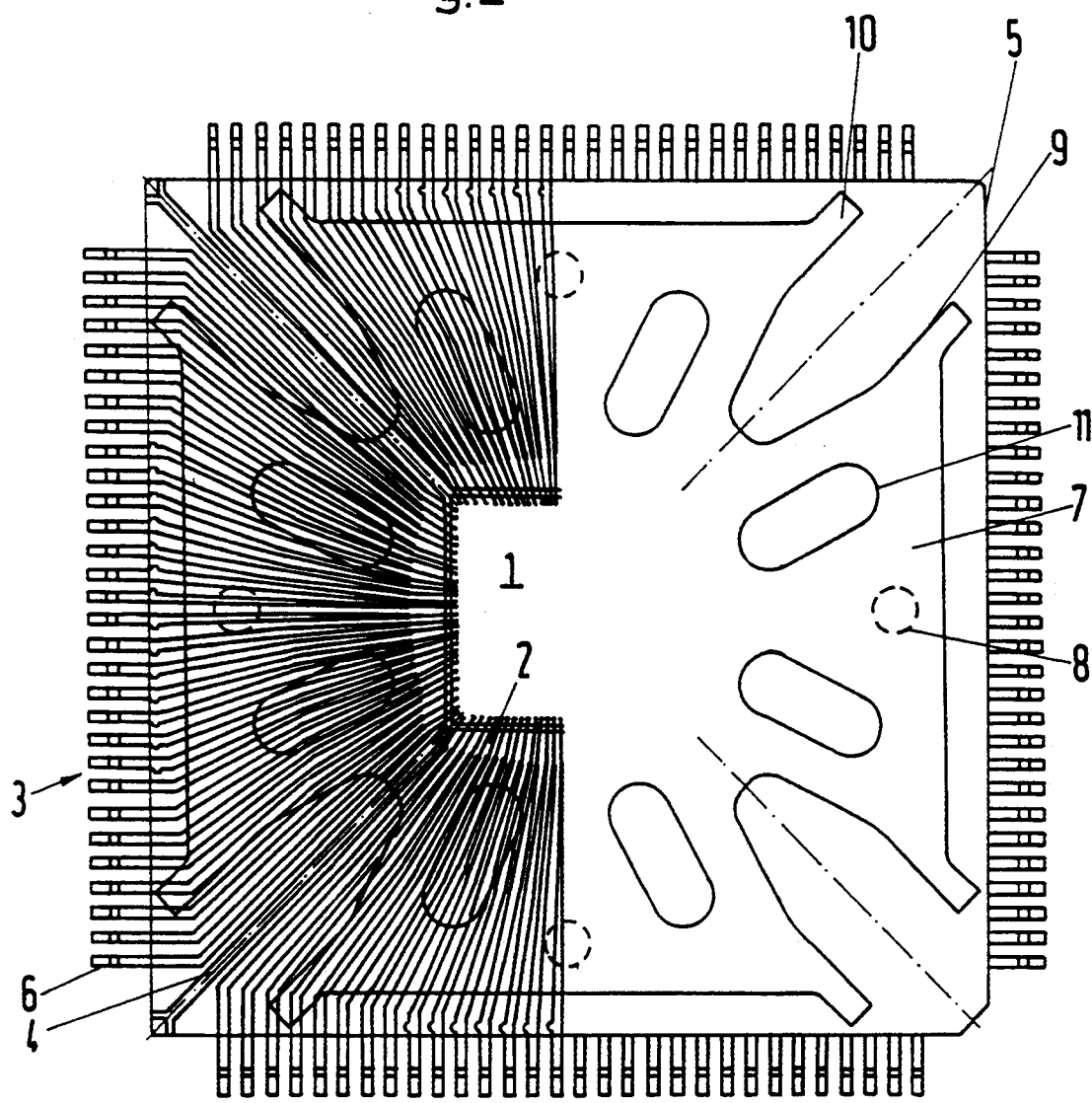
FIG. 2 shows a plan view of the component according to FIG. 1 with drawn-in heat-conducting plate and partially removed plastic enclosure.

The highly integrated electronic component represented in FIGS. 1 and 2 has an approximately square base shape and comprises a semiconductor body 1, the terminal faces of which are connected by bonding wires 2 to terminals 3. The terminals extend in the component initially with a horizontal section 4 up to the side edges of a plastic enclosure 5 and outside the plastic enclosure 5 have bent-off ends 6.

The semiconductor body 1 rests with its underside in surface contact with a heat-conducting plate 7, which plate is substantially planar and supports the horizontal sections 4 of the terminals 3.

The heat-conducting plate optionally is provided with four embossed feet 8, which extend as far as the underside of the plastic enclosure 5.

FIG. 2 illustrates the contour of the heat-conducting plate 7, the contour substantially corresponding to the outer contour of the component. However, in the region of the corners the heat-conducting plate is provided with diagonally running incisions 9, which are laterally bounded in each case by two webs 10, which extend virtually up to the side edges of the plastic enclosure 5.

FIG. 2 indicates that four feet 8 are provided, each of which is arranged close to the edge of the heat-conducting plate 7 and centrally between the diagonally running incisions 9. In order to ensure a large passage cross section for the plastic during the injection molding of the plastic enclosure 5, the incisions 9 extend almost up to the semiconductor body 1. There are further provided between the diagonally running incisions 9 in each case two through-openings 11, which are of an elongate design and are approximately radially aligned. The eight through-openings 11 are distributed approximately evenly around the semiconductor body 1. The through-openings further ensure a large passage cross-section for the plastic during the injection molding of the plastic enclosure.

FIG. 2 further reveals that the heat-conducting plate 7 supports the terminals 3 and is in contact with them. Since the heat-conducting plate regularly consists of electrically conducting material, the plate must be of an electrically insulated design on the upper side, which comes into contact with the terminals 3. For this purpose, the heat-conducting plate 7 according to the invention has a thin insulating layer on the upper side, which is preferably formed by anodizing with a minimum thickness of about 30 $\mu$.

Figure 3:
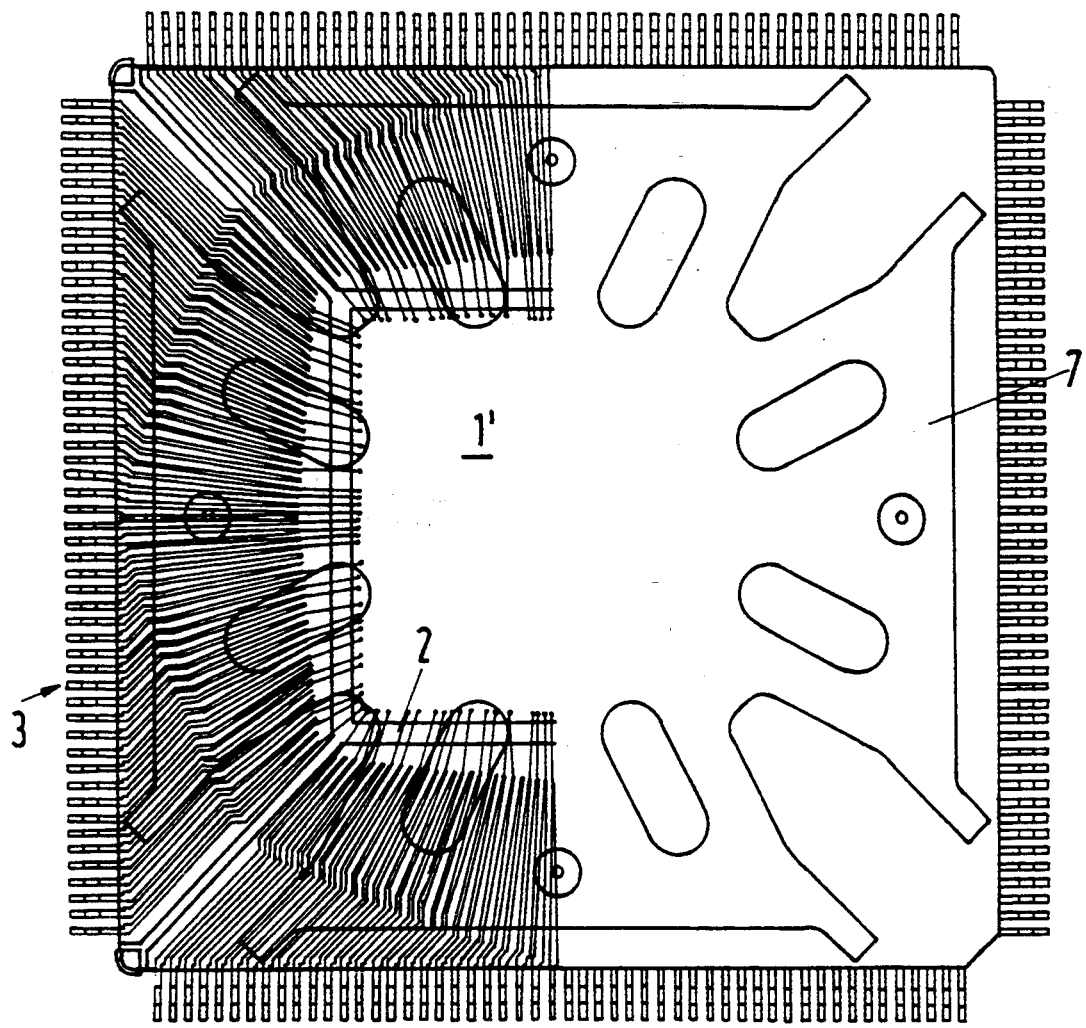
FIG. 3 shows a plan view according to FIG. 2 with a larger semiconductor body.

FIG. 3 illustrates that the heat-conducting plate 7 of FIGS. 1 and 2 can also be used with a significantly larger semiconductor body 1'. Hence, a plate can be used with different sizes of semiconductor bodies.

Figure 4:
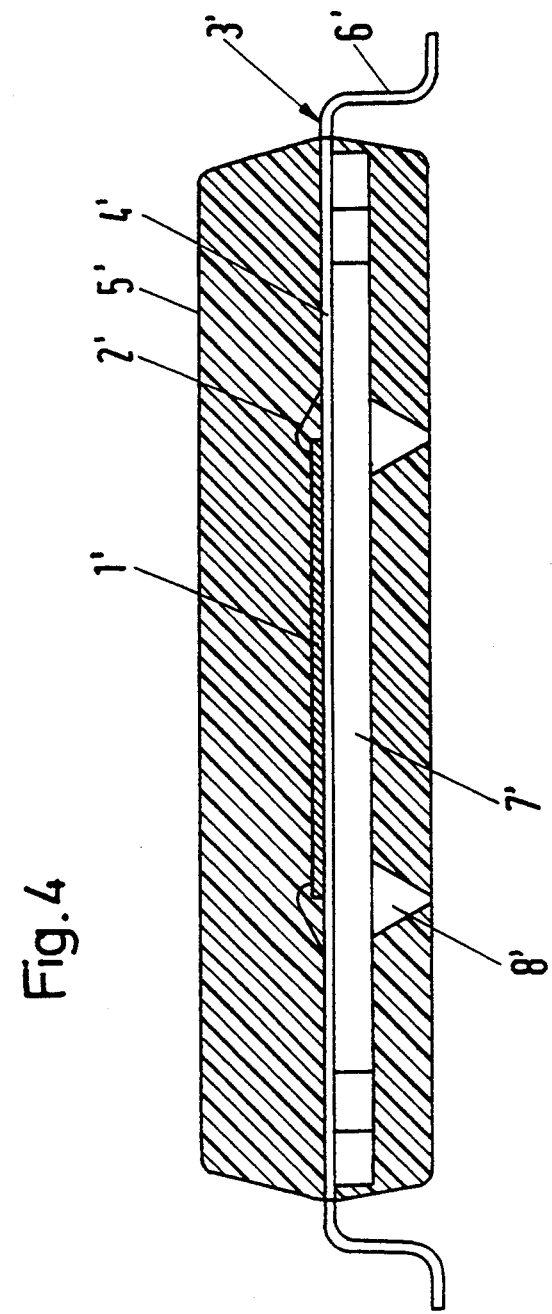
FIG. 4 shows a cross section through a second embodiment of a highly integrated electronic component.
Figure 5:
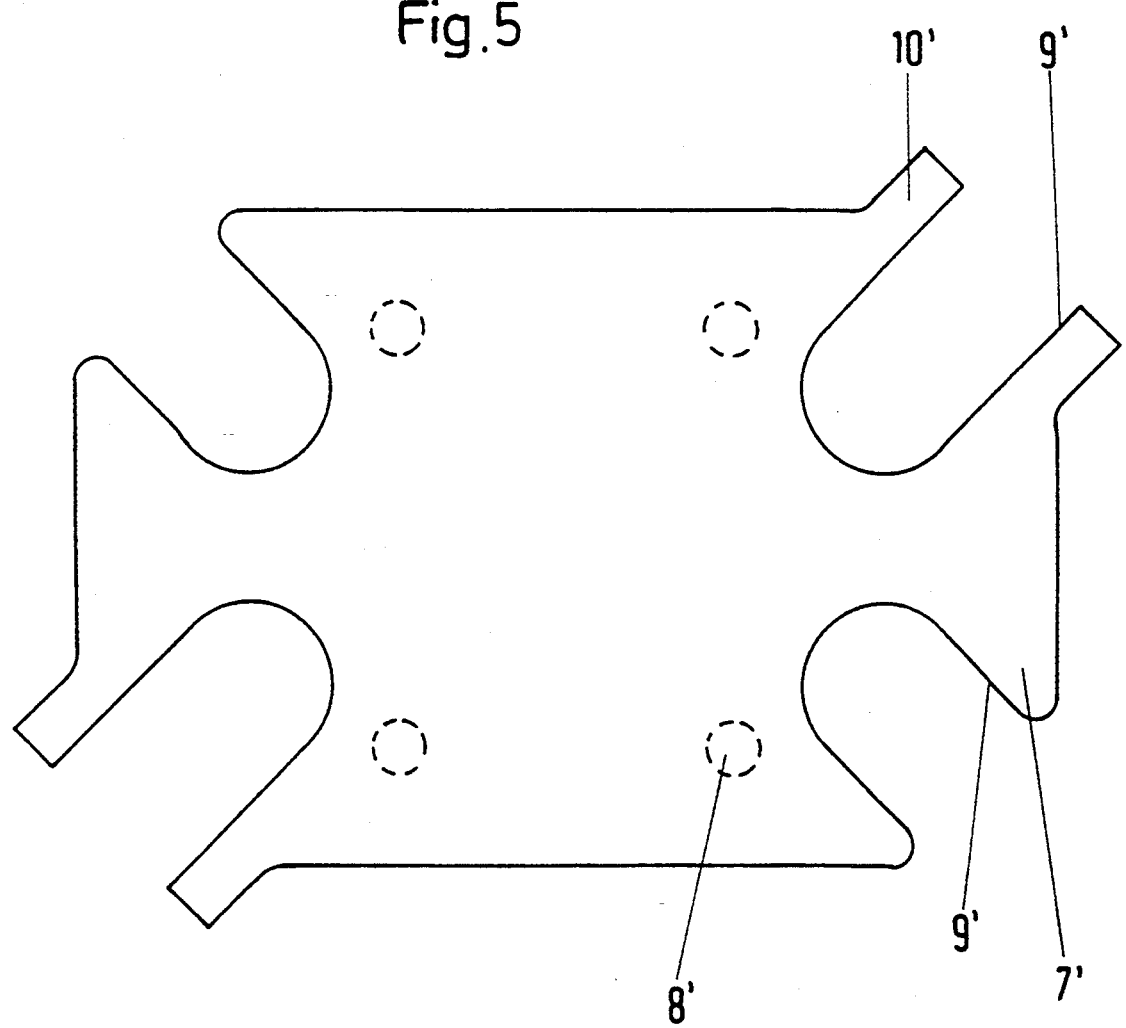
FIG. 5 shows a plan view of the heat-conducting plate used in the case of the component according to FIG. 4.

In FIGS. 4 and 5, a further embodiment is represented, in which the parts corresponding to the embodiment according to FIGS. 1 and 2 are provided with identical reference numerals, but indicated by a "'".

FIG. 4 has only minor differences from the representation of FIG. 1. Specifically, FIG. 5 illustrates that the component is not of a square but of a rectangular design, with two long sides and two short sides. The feet 8' are arranged next to each other on the long sides of the heat-conducting plates 7'. The diagonal incisions 9' are bounded only at two diagonally opposite corners by the webs 10'. The webs extend up to the side edges of the— plastic enclosure 5' whereas at the two other corners these webs 10' are missing. The heat-conducting plate 7' is not provided with further through-openings because its smaller size allows an adequate flow of the plastic from one side of the heat-conducting plate 7' to the other through the incisions 9'.

The diagonal incisions 9, 9' which start from the corners of the heat-conducting plate 7, 7', represent the best arrangement to ensure a high passage of material with as little weakening as possible of the supporting base for the terminals 3.

The heat-conducting plates 7, 7' represented therefore allow trouble-free injection-molding of the plastic enclosure 5, 5' good removal of the heat produced in the semiconductor body 1 as well as good mechanical support of the thin terminals 3 in the region of the horizontal sections 4.

What is claimed is:

1. An electronic component comprising a semiconductor body cast into a plastic enclosure, multiple metallic terminals which protrude from the plastic enclosure, and a heat-conducting plate which is cast into the plastic enclosure and is in surface contact with an underside of the semiconductor body, wherein the heat-conducting plate is substantially planar and bears both against the underside of the semiconductor body and against the underside of the terminals and wherein the upper side of the heat-conducting plate contains an electrically insulating, anodized layer which bears against said underside of the terminals and which is formed by anodizing the heat-conducting plate.

2. The electronic component as claimed in claim 1, wherein the anodized layer has a minimum thickness of about 30 $\mu$.

3. The electronic component as claimed in claim 1, wherein the heat-conducting plate is provided with embossed feet which extend to the underside of the plastic enclosure.

4. The electronic component as claimed in claim 1, wherein the heat-conducting plate has a rectangular outer contour substantially coinciding with a rectangular shape of the plastic enclosure, wherein said plate is provided in each corner with diagonally running incisions.

5. The electronic component as claimed in claim 4, wherein the heat-conducting plate is extended up to side edges of the plastic enclosure by two webs bounding at least one of said incisions.

6. The electronic component as claimed in claim 5, wherein the webs are present at two diagonally opposite corners, wherein at the two other corners the webs are missing.

7. The electronic component as claimed in claim 1, wherein the heat-conducting plate contains through-openings arranged around the semiconductor body.

8. The electronic component as claimed in claim 7, wherein the through-openings are of an elongate design and radially extended from the semiconductor body.

9. The electronic component as claimed in claim 7, wherein the through-openings are arranged in approximately even distribution around the semiconductor body.

10. The electronic component as claimed in claim 1, wherein the electrically insulating layer also bears against said underside of the semiconductor body.

11. An electronic component comprising a semiconductor body cast into a plastic enclosure, multiple metallic terminals which protrude from the plastic enclosure, and a heat-conducting plate which is cast into the plastic enclosure and is in surface contact with an underside of the semiconductor body, wherein the heat-conducting plate is substantially planar and bears both against the underside of the semiconductor body and against the underside of the terminals and wherein the upper side of the heat-conducting plate contains an electrically insulating layer which bears against said underside of the terminals and wherein the heat-conducting plate is provided with embossed feet which extend to the underside of the plastic enclosure.

12. The electronic component as claimed in claim 11, wherein said insulating layer is formed by anodizing the heat-conducting plate.

13. The electronic component as claimed in claim 11, wherein the heat-conducting plate has a rectangular outer contour substantially coinciding with a rectangular shape of the plastic enclosure, wherein said plate is provided in each corner with diagonally running incisions.

14. The electronic component as claimed in claim 13, wherein the heat-conducting plate is extended up to side edges of the plastic enclosure by two webs bounding at least one of said incisions.

15. The electronic component as claimed in claim 14, wherein the webs are present at two diagonally opposite corners, wherein at the two other corners the webs are missing.

16. The electronic component as claimed in claim 14, wherein the heat-conducting plate contains through-openings arranged around the semiconductor body.

17. The electronic component as claimed in claim 16, wherein the through-openings are of an elongate design and radially extended from the semiconductor body.

18. The electronic component as claimed in claim 17, wherein the through-openings are arranged in approximately even distribution around the semiconductor body.

* * * * *